US006758223B1

(12) United States Patent
Cowley et al.

(10) Patent No.: US 6,758,223 B1
(45) Date of Patent: Jul. 6, 2004

(54) PLASMA RIE POLYMER REMOVAL

(75) Inventors: Andy Cowley, Wappingers Falls, NY (US); Peter Emmi, White Plains, NY (US); Timothy Dalton, Ridgefield, CT (US); Christopher Jahnes, Upper Saddle River, NJ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/603,254

(22) Filed: Jun. 23, 2000

(51) Int. Cl.[7] ............................................. B08B 6/00
(52) U.S. Cl. ........................ 134/1.2; 134/26; 134/902; 216/67; 438/700; 438/706; 438/709; 438/718; 438/733; 438/906
(58) Field of Search ...................... 134/1.2, 26, 902; 216/67, 700, 706; 438/706, 709, 700, 733, 718, 906

(56) References Cited

U.S. PATENT DOCUMENTS

| | | | | |
|---|---|---|---|---|
| 5,474,615 A | * | 12/1995 | Ishida et al. .................. | 134/1.2 |
| 5,635,423 A | * | 6/1997 | Huang et al. ................ | 438/638 |
| 5,780,359 A | * | 7/1998 | Brown et al. ................ | 438/659 |
| 5,788,869 A | * | 8/1998 | Dalton et al. ................. | 216/60 |
| 5,980,770 A | * | 11/1999 | Ramachandran et al. ..... | 216/67 |
| 6,030,902 A | | 2/2000 | Hopper et al. .............. | 438/711 |
| 6,159,862 A | * | 12/2000 | Yamada et al. ............. | 438/712 |
| 6,252,290 B1 | * | 1/2001 | Quek et al. .................. | 257/522 |
| 6,207,583 B1 | * | 3/2001 | Dunne et al. ............... | 438/725 |
| 6,242,350 B1 | * | 6/2001 | Tao et al. .................... | 438/690 |
| 6,361,929 B1 | * | 3/2002 | Chung et al. ............... | 430/329 |
| 6,440,230 B1 | * | 8/2002 | Klein .......................... | 148/222 |

FOREIGN PATENT DOCUMENTS

JP 2000352827 12/2000

OTHER PUBLICATIONS

Cheng Y Y et all: "Ultra–low dielectric constant low density material (k=2.2) for Cu damascene", Proceedings of the IEEE 2000 Int'l. Interconnect Technology Conference (Cat. No. 00EX407), Proeecings of the IEEE 2000 Intenrational Interconnect Technology Conference, Burlingame, CA, US Jun. 5–7, 2000, pp. 161–163, XP001066386, 2000 Piscataway, NJ USA.

Somashekhar A et al: "Hydrogen Plasma Removal of Post–Rie Residue for Backend Processing", Journal of the Electrochemical Society, Manchester, New Hampshire, US, vol. 146, no. 6, Jun. 1999 (Jun. 1999), pp. 2318–2321, XP000877000, ISSN: 0013–4651, the whole document.

N/A (Int'l. Search Rpt) Apr. 04, 2002. EPO, Munich, Germany.

* cited by examiner

Primary Examiner—Randy Gulakowski
Assistant Examiner—M. Kornakov
(74) Attorney, Agent, or Firm—Thomas R. FitzGerald, Esq.

(57) ABSTRACT

A method for removal of post reactive ion etch by-product from a semiconductor wafer surface or microelectronic composite structure comprising:
supplying a reducing gas plasma incorporating a forming gas mixture selected from the group consisting of a mixture of $N_2/H_2$ or a mixture of $NH_3/H_2$ into a vacuum chamber in which a semiconductor wafer surface or a microelectronic composite structure is supported to form a post-RIE polymer material by-product on the composite structure without significant removal of an organic, low K material which has also been exposed to the reducing gas plasma; and
removing the post-RIE polymer material by-product with a wet clean.

7 Claims, 1 Drawing Sheet

PLASMA RIE POLYMER REMOVAL

BACKGROUND OF THE INVENTION

1. Field of the Invention

The invention relates to a process for post reactive ion etching (RIE) polymer removal on an organic low K dielectric through the use of reducing plasma chemistry. The process removes extensive post RIE polymer on an organic low K dielectric material by use of a reducing gas plasma and comprises either a forming gas mixture of ($N_2/H_2$) or an ammonia/hydrogen ($NH_3/H_2$) mixture to completely remove the post reactive ion etch by-product from a wafer surface or a Via structure prior to a wet chemical clean. The removal is achieved without significant removal of the organic, low K dielectric material that is exposed to the gas plasma.

2. Description of the Related Art

Existing post RIE plasma clean solutions use oxidizing chemistries; however, these chemistries cannot be utilized with organic low constant (K) dielectrics due to the extremely poor selectivity of the polymer strip/clean to the organic low K dielectric material.

In particular, a case in point is the accomplishment of post RIE polymer cleaning by utilizing a chromic-phosphoric acid tank bath or other solvent based chemistry. In this process, there is a certain time window of approximately 4 hours between completion of the RIE process and the wet cleaning step.

However, some drawbacks of currently existing wet chemical cleaning methods are as follows: an acid based chemistry (without any HF in it) is not efficient in removing polymer that have high silicon content (as found in metal pads located in the support region); and a solvent based chemistry generally takes a longer process time (approximately 10 minutes as compared to 2 to 4 minutes for a typical acid based clean) and typically is encumbered as a result of costs and environmental disposal requirements.

U.S. Pat. No. 5,780,359 disclose polymer removal from top surfaces and sidewalls of a semiconductor wafer by: initiating a flow of feed gas comprising fluorine-containing gases upstream from the process chamber; applying the feed gas means for producing a plasma; supplying effluents of the plasma in the form of reactive species separated from the plasma to the process chamber; applying radio frequency energy to the wafer in the process chamber to generate a lower intensity plasma therein and accompanying wafer self-biasing; applying a magnetic field that rotates slowly in the horizontal plane to the process chamber during the step of applying radio frequency energy to the wafer to enhance plasma generation; and stripping the photoresist and polymer residues from the top surfaces and sidewalls of the post metal-etch wafer with the reactive species and the lower intensity plasma; wherein the pressure in the process chamber is greater than 100 milliTorr A process for removal of post-RIE polymer on Al/Cu metal line is disclosed in U.S. Pat. No. 5,980,770. The process entails: supplying a mixture of an etching gas and an acid neutralizing gas into a vacuum chamber in which the composite structure is supported to form a water soluble material of sidewall polymer rails left behind on the Al/Cu metal line from the RIE process; removing the water soluble material with deionized water; and removing photo-resist from the composite structure by either a water-only plasma process of the chemical down stream etching method; or forming a water-only plasma process to strip the photoresist layer of a semiconductor or microelectronic composite structure previously subjected to a RIE process; supplying a mixture of an etching gas and an acid neutralizing gas into a vacuum chamber on which the structure is supported to form a water soluble material of the sidewall polymer rails left behind on the Al/Cu metal line from the RIE process; and removing the water-soluble material with deionized water.

U.S. Pat. No. 6,009,888 disclose a method of stripping photoresist and polymer from a wafer after a dry etch, comprising: forming a photoresist pattern over a semiconductor structure; immersing the substrate in a bath comprising (a) peroxydisulfate ($S_2O_8^{2-}$) (bisulfate), (2) hydrochloric acid (HCl) and (3) water; and agitating the semiconductor structure in the solution; said bath being at a temperature in a range of between about 90 and 100° C.; irradiating the semiconductor structure, and the photoresist pattern with a UV laser with a wave length between about 150 nm and 300 nm, and with an energy between about 4 and 8.0 eV and laser pulses in a range of between about 10 and 10,000 per wafer to remove the photoresist.

Previous approaches for removing RIE polymer from semiconductor materials used no post RIE clean, and this led to high contact resistance and reliability failures.

Alternatively, when previous approaches utilized wet chemical only clean, this caused severe contamination of the wet chemical bath from delaminating fluoropolymer on the wafer surface deposited during RIE processes.

There is a need in the art of cleaning RIE etched materials to remove fluoropolymer/hydrocarbon from the surface of an organic low k dielectric material without excessive removal of organic dielectric material.

SUMMARY OF THE INVENTION

One object of the present invention is to provide a process to completely remove post-reactive ion etch (RIE) by-product from a wafer surface or Via structure prior to wet chemical clean.

Another object of the present invention is to provide a process for removing post-reactive ion etch (RIE) by-product from a wafer surface or Via structure prior to a wet chemical clean by utilizing a reducing gas plasma incorporating a forming gas mixture of $N_2/H_2$.

A further object of the present invention is to provide a process to completely remove post-reactive ion etch (RIE) by-product from a wafer surface or Via structure prior to a wet chemical clean by utilizing a reducing gas plasma incorporating a forming gas mixture of $NH_3/H_2$.

A still further object of the present invention is to provide a process for completely removing post-reactive ion etch (RIE) by-product from a wafer surface or Via structure prior to a wet chemical clean without significant removal of an organic, low dielectric constant material which is exposed to either a reducing gas plasma incorporating either a forming gas mixture of $N_2/H_2$ or $NH_3/H_2$.

A yet further object of the present invention is to provide a process for completely removing post-reactive ion etch (RIE) fluoropolymer strip from either single or dual damascene structures by utilizing a reducing gas plasma incorporating either a forming gas mixture of $N_2/H_2$ or $NH_3/H_2$.

DESCRIPTION OF THE PREFERRED EMBODIMENTS

Figure 1:
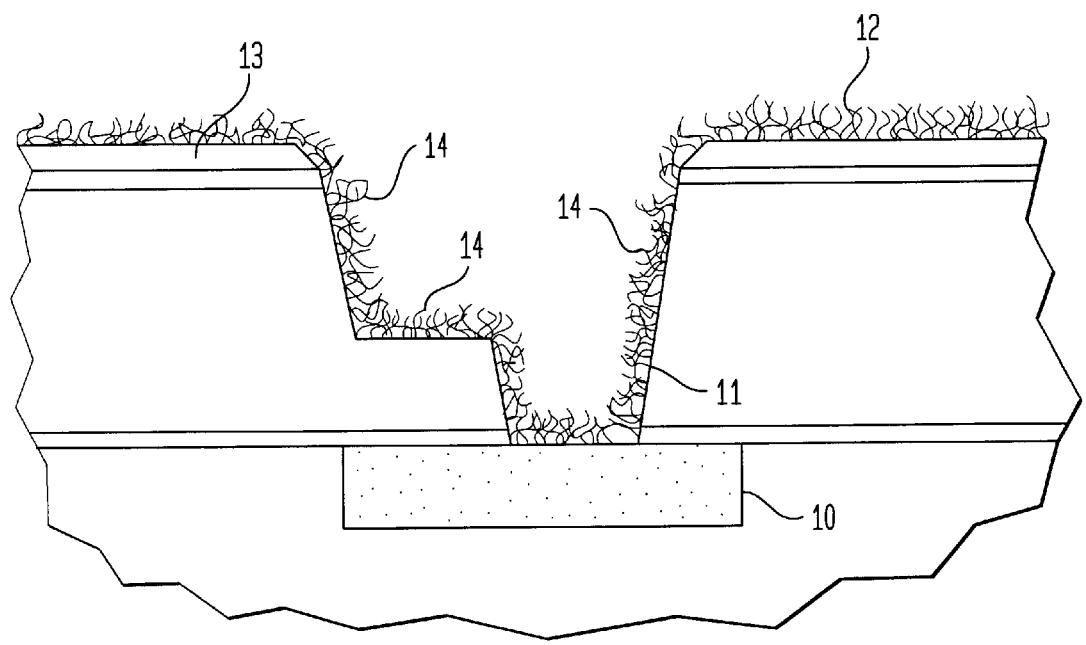
FIG. 1 is a diagram showing a wafer surface previously etched and on which a post RIE fluoropolymer remnant is disposed on an organic low K dielectric.

The foregoing and other objects and advantages of the invention will be better understood by resort to the following detailed description of the preferred embodiments of the invention.

In previous processes for post RIE plasma clean solutions, the use of oxidizing chemistries are well known; however, these chemistries cannot be utilized with organic low K dielectrics due to the fact that there is extremely poor selectivity of the polymer strip/clean to the low K dielectric material.

On the other hand, when previous approaches to removing RIE fluoropolymer used no post RIE clean, this led to high contact resistance and reliability failures. Or, when wet chemical only clean was utilized to remove RIE fluoropolymer on wafer surfaces deposited during the RIE process, this caused severe contamination of the wet chemical bath due to delamination of the fluoropolymer on the wafer surface.

In the context of the invention, with the current trend towards the use of hard mask (silicon dioxide and silicon nitride layers), the use of the reducing gas plasma chemistry following the RIE process enables removal of the post-RIE polymer to be achieved efficiently without significant removal of an organic, low dielectric constant material which is exposed to the gas plasma.

In this connection, reference is made to FIG. 1 which depicts a wafer surface comprising metal 10 on which there is an organic low k dielectric material 11, a silicon nitride layer 12 and a silicon dioxide layer 13, the latter two of which may constitute hard masks. Following post reactive ion etching, a fluoropolymer layer 14 remains and is in need of removal prior to completion of the process for forming the semiconductor wafer or chip.

After the exposure and development of the. photo-resist, and the use of RIE to define the metal line, the post RIE fluoropolymer 14 of the composite chip is subjected to a reducing gas plasma that incorporates a forming gas mixture of $N_2/H_2$ to completely remove the post-reactive ion etch fluoropolymer by-product from the wafer surface prior to the use of a wet chemical clean. The removal of the post-reactive ion etch fluoropolymer by-product is accomplished without significant removal (<200 Å) of the organic, low dielectric constant material 11, which has also been exposed to the gas plasma of the forming gas mixture of $N_2/H_2$.

In a further embodiment of the invention process, the reducing gas plasma incorporates a forming gas mixture of $NH_3/H_2$ to completely remove the post-reactive ion etch fluoropolymer by-product from the wafer surface prior to a wet chemical clean. Significantly, this removal is also achieved without significant removal (<200 Å) of the organic, low dielectric constant material which has also been exposed to the gas plasma.

In the present invention, use of the particular reducing gas plasma incorporating a forming gas mixture of $N_2/H_2$ or $NH_3/H_2$ is important to have a good process as a post-clean, since removing the fluoropolymer prevents enhancement of corrosion of the metal line; however, the reducing gas plasma incorporating the forming gas mixture of the invention, unlike existing post RIE plasma clean solutions is very selective with respect to removal of the fluoropolymer while only removing an insignificant amount of the organic low k dielectric.

Accordingly, the prior art process of not being able to use any post RIE clean (on the basis that it would led to high contact resistance and reliability failures) or the prior art use of a wet chemical clean only that would cause severe contamination of the wet chemical bath from delamination of the fluoropolymer on the wafer surface (deposited during the RIE process) are avoided.

While the invention process of utilizing a reducing gas plasma incorporating either a forming gas mixture of $N_2/H_2$ or $NH_3/H_2$ to completely remove post reactive ion etch polymer by-product from a wafer surface, the invention is equally as useful for particularly removing post reactive ion etch polymer by-product from Via structures prior to a wet chemical clean.

We claim:

1. A method for removal of post reactive ion etch by-product from a semiconductor having organic low K material, the method water surface or microelectronic composite structure comprising:

supplying a reducing gas plasma comprising a forming gas mixture selected from the group consisting of a mixture of $N_2/H_2$ and a mixture of $NH_3/H_2$ into a vacuum chamber in which a semiconductor wafer surface or a microelectronic composite structure is supported to form a post-RIE polymer material by-product on the composite structure without significant removal of said organic, low K material which has also been exposed to said reducing gas plasma; and removing said post-RIE polymer material by-product with a wet clean.

2. The method of claim 1 wherein said reducing gas plasma comprises a mixture of $N_2/H_2$.

3. The method of claim 1 wherein said reducing gas plasma comprises a mixture of $NH_3/H_2$.

4. The method of claim 1 wherein said composite structure is a Via structure.

5. The method of claim 1 wherein said semiconductor wafer surface is a dual damascene structure.

6. The method of claim 4 wherein said Via structure is a single damascene structure.

7. The method of claim 1, wherein the amount of organic low k material removed is less than 200 Å.

* * * * *

UNITED STATES PATENT AND TRADEMARK OFFICE
CERTIFICATE OF CORRECTION

PATENT NO. : 6,758,223 B1
DATED : October 29, 2004
INVENTOR(S) : Andy Cowley et al.

It is certified that error appears in the above-identified patent and that said Letters Patent is hereby corrected as shown below:

<u>Title page,</u>
Item [73], Assignee, please add as co-assignee -- International Business Machines Corp. --

Signed and Sealed this

Twenty-eighth Day of June, 2005

JON W. DUDAS
*Director of the United States Patent and Trademark Office*